(12) United States Patent
Kang et al.

(10) Patent No.: US 11,787,943 B2
(45) Date of Patent: Oct. 17, 2023

(54) CURABLE SILICONE COMPOSITION AND OPTICAL SEMICONDUCTOR DEVICE

(71) Applicant: DOW SILICONES CORPORATION, Midland, MI (US)

(72) Inventors: Hyun-Ji Kang, Chungcheongbuk-do (KR); Ju-Young Yook, Sejong (KR)

(73) Assignee: Dow Silicones Corporation, Midland, MI (US)

( * ) Notice: Subject to any disclaimer, the term of this patent is extended or adjusted under 35 U.S.C. 154(b) by 806 days.

(21) Appl. No.: 16/629,875

(22) PCT Filed: Jun. 27, 2018

(86) PCT No.: PCT/KR2018/007288
§ 371 (c)(1),
(2) Date: Jan. 9, 2020

(87) PCT Pub. No.: WO2019/013471
PCT Pub. Date: Jan. 17, 2019

(65) Prior Publication Data
US 2021/0087393 A1    Mar. 25, 2021

(30) Foreign Application Priority Data

Jul. 10, 2017 (KR) .......... 10-2017-0087305

(51) Int. Cl.
*C08L 83/04* (2006.01)
*C09D 183/04* (2006.01)
(Continued)

(52) U.S. Cl.
CPC ............ *C08L 83/04* (2013.01); *C09D 183/04* (2013.01); *C09J 183/04* (2013.01); *H01L 33/56* (2013.01);
(Continued)

(58) Field of Classification Search
CPC .......... H01L 33/40; H01L 33/56; H01L 33/62; C08L 83/04; C09D 183/04; C09J 183/04
See application file for complete search history.

(56) References Cited

U.S. PATENT DOCUMENTS 4,271,425 A * 6/1981 Wong ................... C08K 5/15
526/86
6,323,253 B1 * 11/2001 Bennington ........ C08F 290/068
522/18
(Continued)

FOREIGN PATENT DOCUMENTS

CN    102190890 A    9/2011
CN    102906309 A    1/2013
(Continued)

OTHER PUBLICATIONS

Niu, Yanxia et al., "Solubility of dilute SO2 in 1,4-dioxane, 15-crown-5 ether, polyethylene glycol 200, polyethylene glycol 300, and their binary mixtures at 308.15 K and 122.66 kPa", Fluid Phase Equilibria, 2013, pp. 65-70, vol. 344.
(Continued)

*Primary Examiner* — Brook Kebede
(74) *Attorney, Agent, or Firm* — WARNER NORCROSS + JUDD LLP (57) ABSTRACT

A curable silicone composition is provided. The curable silicone composition is useful for forming a cured product which inhibits the discoloration of silver electrodes or a silver-plated substrate in an optical semiconductor device due to a sulfur-containing gas. The curable silicone composition comprises at least one type of a crown compound. An optical semiconductor device is also provided. The optical semiconductor device has excellent reliability after a sulfur resistance test, in which an optical semiconductor device on silver electrodes or a silver-plated substrate is sealed, cov-
(Continued)

ered, or adhered with a cured product of the curable silicone composition.

16 Claims, 1 Drawing Sheet

(51) Int. Cl.
    *C09J 183/04*    (2006.01)
    *H01L 33/56*    (2010.01)
    *H01L 33/40*    (2010.01)
    *H01L 33/62*    (2010.01)

(52) U.S. Cl.
    CPC ......... *C08L 2203/206* (2013.01); *H01L 33/40* (2013.01); *H01L 33/62* (2013.01)

(56) References Cited

U.S. PATENT DOCUMENTS

| | | | |
|---|---|---|---|
| 6,475,331 B1 | 11/2002 | O'Connor et al. | |
| 7,026,397 B2 | 4/2006 | Hasegawa et al. | |
| 2005/0228128 A1 | 10/2005 | Kotani et al. | |
| 2011/0224385 A1 | 9/2011 | Shoji et al. | |
| 2013/0032853 A1 | 2/2013 | Kawata et al. | |
| 2015/0329681 A1* | 11/2015 | Suto | C09D 183/04 556/455 |
| 2016/0020419 A1* | 1/2016 | Walzer | H01L 51/441 438/82 |
| 2016/0280938 A1 | 9/2016 | Miyamoto et al. | |

FOREIGN PATENT DOCUMENTS

| | | |
|---|---|---|
| CN | 105764992 A | 7/2016 |
| JP | 2012111850 A | 6/2012 |
| KR | 1020140129923 A | 11/2014 |
| TW | 201439220 A | 10/2014 |
| TW | I485140 B | 5/2015 |
| WO | 2014130784 A1 | 8/2014 |
| WO | 2016006773 A1 | 1/2016 |

OTHER PUBLICATIONS

Machine assisted English translation of CN102190890A obtained from https://worldwide.espacenet.com on May 27, 2021, 24 pages.
International Search Report for PCT/KR2018/007288 dated Oct. 30, 2018, 4 pages.
Machine assisted English translation of JP2012111850A obtained from https://patents.google.com on Jan. 8, 2020, 17 pages.
Machine assisted English translation of KR1020140129923A obtained from https://patents.google.com on Jan. 8, 2020, 11 pages.
Machine assisted English translation of WO2016006773A1 obtained from https://patents.google.com on Jan. 8, 2020, 16 pages.
Xu, Zixuan et al., "A New Star-shaped Carbazole Derivative with Polyhedral Oligomeric Silsesquioxane Core: Crystal Structure and Unique Photoluminescence Property," Journal of Fluorescence, 2016, vol. 26, Issue 1, pp. 149-154.

* cited by examiner

US 11,787,943 B2

CURABLE SILICONE COMPOSITION AND OPTICAL SEMICONDUCTOR DEVICE

CROSS-REFERENCE TO RELATED APPLICATIONS

This application is the National Stage of International Appl. No. PCT/KR2018/007288 filed on 27 Jun. 2018, which claims priority to Korean Appl. No. 10-2017-0087305 filed on 10 Jul. 2017, the content of which is hereby incorporated by reference.

TECHNICAL FIELD

The present invention relates to a curable silicone composition and an optical semiconductor device made by using the composition.

BACKGROUND ART

Curable silicone compositions which are cured by a hydrosilylation reaction or a condensation reaction are used to seal, cover, or adhere optical semiconductor elements in optical semiconductor devices. There is a demand for such a curable silicone composition to be able to inhibit the discoloration of silver electrodes or a silver-plated substrate in the optical semiconductor device due to a sulfur-containing gas such as hydrogen sulfide in the air.

For example, Japanese Unexamined Patent Application Publication No. 2012-111850 A discloses a silicone resin composition comprising: 100 parts by mass of a curable silicone resin composition, 0.01 to 5 parts by mass of a zinc compound, and 0.01 to 5 parts by mass of a compound having a polyalkylene oxide chain, wherein the curable silicone resin composition comprises: an organopolysiloxane having at least two silicon-bonded alkenyl groups, an organohydrogenpolysiloxane having at least two silicon-bonded hydrogen atoms, and a hydrosilylation reaction catalyst; and International Patent Application Publication No. WO 2016/006773 A1 discloses a curable polyorganosiloxane composition comprising: at least one first siloxane compound having a silicon-bonded alkenyl group at a terminal, at least one second siloxane compound having a silicon-bonded hydrogen at a terminal, and about 0.05 wt % to about 3 wt % of a hydrophilic polyalkylene oxide compound based on the total weight of the first and second siloxane compounds.

However, it was determined that such a curable silicone composition has a problem in that a cured product of the composition has low transmittance due to containing the zinc compound and the polyalkylene oxide compound. In addition, even such a curable silicone composition has a problem in that it cannot sufficiently inhibit the discoloration of silver electrodes or a silver-plated substrate in the optical semiconductor device due to a sulfur-containing gas in the air.

PRIOR ART REFERENCE

Patent Reference (Patent Document 1) Japanese Unexamined Patent Application Publication No. 2012-111850 A
(Patent Document 2) International Patent Application Publication No. WO 2016/006773 A1

DISCLOSURE OF INVENTION

Technical Problem

An object of the present invention is to provide a curable silicone composition for forming a cured product which inhibits the discoloration of silver electrodes or a silver-plated substrate in an optical semiconductor device due to a sulfur-containing gas in the air. In addition, another object of the present invention is to provide an optical semiconductor device having excellent reliability after a sulfur resistance test.

Solution to Problem

The curable silicone composition of the present invention comprises from 0.001 to 5% by mass of at least one type of a crown compound.

The crown compound is preferably a crown ether compound, a cyclic polyamine compound, or a cyclic polythioether compound.

The crown ether compound is preferably a crown ether compound, a benzo crown ether compound, a dibenzo crown ether compound, an aminobenzo crown ether compound, an acetylbenzo crown ether compound, a carboxybenzo crown ether compound, a bromobenzo crown ether compound, an aza crown ether compound, or a diaza crown ether compound.

The curable silicone composition may be cured by a hydrosilylation reaction.

The hydrosilylation reaction-curable silicone composition preferably comprises:
(A) an organopolysiloxane having at least two aliphatic unsaturated hydrocarbon groups per molecule;
(B) an organohydrogenpolysiloxane having at least two silicon-bonded hydrogen atoms per molecule;
(C) at least one type of a crown compound; and
(D) a hydrosilylation reaction catalyst.

The curable silicone composition may further comprise: (E) a hydrosilylation reaction inhibitor, in an amount from 0.01 to 3 parts by mass per total 100 parts by mass of components (A) to (D).

The curable silicone composition may further comprise: (F) an adhesion promotor, in an amount from 0.01 to 3 parts by mass per total 100 parts by mass of components (A) to (D).

The curable silicone composition may be a composition for sealing, coating, or adhering an optical semiconductor element.

An optical semiconductor device of the present invention comprises: an optical semiconductor element on silver electrodes or a silver-plated substrate, wherein the optical semiconductor element is sealed, coated, or adhered with a cured product of the curable silicone composition described above.

The optical semiconductor element in the optical semiconductor device is preferably a light emitting diode.

Advantageous Effects of Invention

The curable silicone composition of the present invention is characterized in that it forms a cured product which inhibits the discoloration of silver electrodes or a silver-plated substrate in an optical semiconductor device due to a sulfur-containing gas in the air. In addition, the optical semiconductor device of the present invention is characterized in that the discoloration of silver electrodes or a silver-plated substrate due to a sulfur-containing gas in the air is inhibited.

MODE FOR THE INVENTION

First, a curable silicone composition of the present invention will be described in detail.

The curable silicone composition of the present invention comprises from 0.001 to 5% by mass of at least one type of a crown compound.

The crown compound is not particularly limited, but is a compound having a crown structure. Examples of the crown compound include a crown ether compound, a cyclic polyamine compound, and a cyclic polythioether compound. The crown compound is preferably a crown ether compound such as a crown ether compound, a benzo crown ether compound, a dibenzo crown ether compound, an aminobenzo crown ether compound, an acetylbenzo crown ether compound, a carboxybenzo crown ether compound, a bromobenzo crown ether compound, an aza crown ether compound, a diaza crown ether compound, and other compound having crown ether structure.

Examples of the crown ether compound include 12-crown 4-ether, 15-crown 5-ether, 18-crown 6-ether, and 24-crown 8-ether. Examples of the benzo crown ether compound include benzo-12-crown 4-ether, benzo-15-crown 5-ether, and benzo-18-crown 6-ether. Examples of the dibenzo crown ether compound include dibenzo-18-crown 6-ether. Examples of the aminobenzo crown ether compound include aminobenzo-15-crown 5-ether. Examples of the acetylbenzo crown ether compound include 4'-acetylbenzo-15-crown 5-ether, 4'-acetylbenzo-18-crown 6-ether, and 4'-acetyl-benzo-15-crown 5-ether. Examples of the carboxybenzo crown ether compound include 4-carboxybenzo-18-crown 6-ether, and 4-carboxybenzo-15-crown 5-ether. Examples of the bromobenzo crown ether compound include 4-bromobenzo-18-crown 6-ether, and 4-bromobenzo-15-crown 5-ether. Examples of the aza crown ether compound include 4'-1-aza-12-crown 4-ether, 1-aza-18-crown 6-ether, and 1-aza-15-crown 5-ether. Examples of the diaza crown ether compound include diaza-18-crown 6-ether. Examples of the other crown ether compound include bis(1,4-phenylene)-34-crown 10-ether, 15-crown-4 [4-(2,4-dinitrophenylazo)phenol], 18-crown-5 [4-(2,4-dinitrophenylazo)phenol], and 2.2.2-cryptand.

The content of the crown compound is from 0.001 to 5% by mass of the composition. Preferably, the lower limit thereof is 0.005% by mass, 0.01% by mass, or 0.05% by mass of the composition, while the upper limit thereof is 4% by mass, 3% by mass, or 2% by mass of the composition. This is because when the content of the crown compound is greater than or equal to the lower limit of the aforementioned range, the discoloration of the silver electrodes or the silver-plated substrate is sufficiently suppressed, whereas when the content is less than or equal to the upper limit of the aforementioned range, a cured product of the composition has good heat stability.

Cure system of the curable silicone composition is not limited. Examples of the cure system include a hydrosilylation reaction, a condensation reaction, and a UV radiation reaction, and a hydrosilylation reaction is particularly preferable.

The curable silicone composition which is cured by a hydrosilylation preferably comprises:
(A) an organopolysiloxane having at least two aliphatic unsaturated hydrocarbon groups per molecule;
(B) an organohydrogenpolysiloxane having at least two silicon-bonded hydrogen atoms per molecule;
(C) at least one type of a crown compound; and
(D) a hydrosilylation reaction catalyst.

Component (A) is a base compound of the present composition and is an organopolysiloxane having at least two aliphatic unsaturated hydrocarbon groups per molecule. Examples of the aliphatic unsaturated hydrocarbon groups include alkenyl groups having from 2 to 12 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups, among which vinyl groups are preferable. In addition, examples of groups bonding to silicon atoms other than the aliphatic unsaturated hydrocarbon groups in component (A) include alkyl groups having from 1 to 12 carbon atoms such as methyl groups, ethyl groups, propyl groups, isopropyl groups, butyl groups, isobutyl groups, tert-butyl groups, pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenylpropyl groups; and groups in which some or all of the hydrogen atoms of these groups are substituted with halogen atoms such as fluorine atoms, chlorine atoms, or bromine atoms. Furthermore, the silicon atoms in component (A) may have small amounts of hydroxyl groups or alkoxy groups such as methoxy groups or ethoxy groups within a range that does not impair the object of the present invention.

Examples of the molecular structure of component (A) include a straight-chain structure, a partially branched straight-chain structure, a branched-chain structure, and a three-dimensional reticular structure. Component (A) may be one type of organopolysiloxane having these molecular structures or may be a mixture of two or more types of organopolysiloxanes having these molecular structures.

Component (A) is a liquid or a solid at 25° C. If component (A) is a liquid at 25° C., the viscosity of the liquid at 25° C. is preferably in the range of from 10 to 1,000,000 mPa·s or in the range of from 10 to 1,000,000 mPa·s. This viscosity may, for example, be determined by measurement using a B-type viscometer in accordance with JIS K 7117-1.

Examples of such component (A) include dimethylpolysiloxanes capped at both molecular terminals with dimethylvinylsiloxy groups, dimethylsiloxane-methylvinylsiloxane copolymers capped at both molecular terminals with dimethylvinylsiloxy groups, dimethylsiloxane-methylphenylsiloxane copolymers capped at both molecular terminals with dimethylvinylsiloxy groups, methylphenylpolysiloxanes capped at both molecular terminals with dimethylvinylsiloxy groups, dimethylsiloxane-methylvinylsiloxane copolymers capped at both molecular terminals with trimethylsiloxy groups, dimethylsiloxane-methylvinylsiloxane-methylphenylsiloxane copolymers capped at both molecular terminals with trimethylsiloxy groups, copolymers consisting of a $(CH_3)_3SiO_{1/2}$ unit, a $(CH_3)_2(CH_2\!\!=\!\!CH)SiO_{1/2}$ unit, and an $SiO_{4/2}$ unit, copolymers consisting of a $(CH_3)_2(CH_2=CH)SiO_{1/2}$ unit and an $SiO_{4/2}$ unit, and mixtures of two or more types thereof.

Component (B) is a crosslinking agent of the present composition and is an organohydrogenpolysiloxane having at least two silicon-bonded hydrogen atoms per molecule. Examples of groups bonding to silicon atoms other than hydrogen atoms in component (B) include alkyl groups having from 1 to 12 carbon atoms such as methyl groups, ethyl groups, propyl groups, isopropyl groups, butyl groups, isobutyl groups, tert-butyl groups, pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenylpropyl groups; and groups in which some or all of the hydrogen atoms of these groups are substituted with halogen atoms such as fluorine atoms, chlorine atoms, or bromine atoms. Furthermore, the silicon atoms in component (B) may have small amounts of hydroxyl groups or alkoxy groups such as methoxy groups or ethoxy groups within a range that does not impair the object of the present invention.

Examples of the molecular structure of component (B) include straight-chain, partially branched straight-chain, branched chain, cyclic, and three-dimensional reticular structures, and the molecular structure is preferably a partially branched straight-chain, branched chain, or three-dimensional reticular structure.

Component (B) is a solid or a liquid at 25° C. If component (B) is a liquid at 25° C., the viscosity of the liquid at 25° C. is preferably at most 10,000 mPa·s, in the range of from 0.1 to 5,000 mPa·s, or in the range of from 0.5 to 1,000 mPa·s. This viscosity may, for example, be determined by measurement using a B-type viscometer in accordance with JIS K 7117-1.

Examples of such component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, methylhydrogenpolysiloxanes capped at both molecular terminals with trimethylsiloxy groups, dimethylsiloxane-methylhydrogensiloxane copolymers capped at both molecular terminals with trimethylsiloxy groups, dimethylpolysiloxanes capped at both molecular terminals with dimethylhydrogensiloxy groups, dimethylsiloxane-methylhydrogensiloxane copolymers capped at both molecular terminals with dimethylhydrogensiloxy groups, methylhydrogensiloxane-diphenylsiloxane copolymers capped at both molecular terminals with trimethylsiloxy groups, methylhydrogensiloxane-diphenylsiloxane-dimethylsiloxane copolymers capped at both molecular terminals with trimethylsiloxy groups, copolymers consisting of $(CH_3)_2HSiO_{1/2}$ units and $SiO_{4/2}$ units, copolymers consisting of $(CH_3)_2HSiO_{1/2}$ units, $SiO_{4/2}$ units, and $(C_6H_5)SiO_{3/2}$ units, and mixtures of two or more types thereof.

The content of component (B) is not limited, but it is preferably in an amount such that the content of silicon-bonded hydrogen atoms in this component is from 0.1 to 10 mol and preferably from 0.5 to 5 mol per 1 mol of aliphatic unsaturated hydrocarbon groups in component (A). This is because when the content of component (B) is less than or equal to the upper limit of the aforementioned range, the mechanical characteristics of the obtained cured product are good, whereas when the content of component (B) is greater than or equal to the lower limit of the aforementioned range, the curability of the obtained composition is good.

Component (C) is at least one type of a crown compound. Examples of component (C) include the crown ether compound, the cyclic polyamine compound, and the cyclic polythioether compound, and the crown ether compound is particularly preferable. The crown ether compound is preferably the crown ether compound mentioned above.

The content of component (C) is from 0.001 to 5% by mass of the composition. Preferably, the lower limit thereof is 0.005% by mass, 0.01% by mass, 0.05% by mass of the composition, while the upper limit thereof is 4% by mass, 3% by mass, or 2% by mass of the composition. This is because when the content of component (C) is greater than or equal to the lower limit of the aforementioned range, the discoloration of the silver electrodes or the silver-plated substrate is sufficiently suppressed, whereas when the content is less than or equal to the upper limit of the aforementioned range, a cured product of the composition has good heat stability.

Component (D) is a platinum hydrosilylation reaction catalyst used to accelerate the curing of the present composition. Examples of component (D) include finely powdered platinum; platinum black; chloroplatinic acid, alcohol-modified chloroplatinic acid; chloroplatinic acid/diolefin complexes; platinum/olefin complexes; platinum/carbonyl complexes such as platinum bis(acetoacetate), and platinum bis(acetylacetonate); chloroplatinic acid/alkenylsiloxane complexes such as chloroplatinic acid/divinyltetramethyl disiloxane complexes, and chloroplatinic acid/tetravinyl tetramethyl cyclotetrasiloxane complexes; platinum/alkenylsiloxane complexes such as platinum/divinyltetramethyl disiloxane complexes, and platinum/tetravinyl tetramethyl cyclotetrasiloxane complexes; complexes of chloroplatinic acid and acetylene alcohols; and mixtures of two or more types thereof. In particular, platinum-alkenylsiloxane complexes are preferable in that they yield an excellent accelerating effect.

Examples of the alkenylsiloxane used in the platinum-alkenylsiloxane complex include 1,3-divinyl-1,1,3,3-tetramethyldisiloxane, 1,3,5,7-tetramethyl-1,3,5,7-tetravinylcyclotetrasiloxane, alkenylsiloxane oligomers in which some of the methyl groups of these alkenylsiloxanes are substituted with ethyl groups, phenyl groups, or the like, and alkenylsiloxane oligomers in which the vinyl groups of these alkenylsiloxanes are substituted with allyl groups, hexenyl groups, or the like. In particular, 1,3-divinyl-1,1,3,3-tetramethyldisiloxane is preferable in that the stability of the platinum-alkenylsiloxane complex that is produced is good.

In order to improve the stability of the platinum-alkenylsiloxane complexes, it is preferable to dissolve these platinum-alkenylsiloxane complexes in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane or an organosiloxane oligomer such as a dimethylsiloxane oligomer, and it is particularly preferable to dissolve the complexes in an alkenylsiloxane oligomer.

The content of component (D) is not limited, but is preferably in an amount such that the content of platinum atoms in component (D) is in the range of from 0.01 to 500 ppm, preferably in the range of from 0.01 to 100 ppm or in the range of from 0.1 to 50 ppm in terms of mass units with respect to the present composition. This is because when the content of component (D) is greater than or equal to the lower limit of the aforementioned range, the curability of the obtained composition is good, whereas when the content of component (D) is less than or equal to the upper limit of the aforementioned range, the coloration of the obtained cured product is suppressed.

The present composition may contain (E) a hydrosilylation reaction inhibitor in order to prolong the usable time at ambient temperature and to improve storage stability. Examples of component (E) include alkyne alcohols such as 1-ethynylcyclohexan-1-ol, 2-methyl-3-butyn-2-ol, 3,5-dimethyl-1-hexyn-3-ol, and 2-phenyl-3-butyn-2-ol; enyne compounds such as 3-methyl-3-penten-1-yne and 3,5-dimethyl-3-hexen-1-yne; alkynoxysilanes such as dimethyl bis(3-methyl-1-butyn-3-oxy)silane and methylvinyl bis(3-methyl-1-butyn-3-oxy)silane; and triallylisocyanurate compounds.

The content of component (E) is not limited, but is preferably in the range of from 0.0001 to 5 parts by mass, in the range of from 0.001 to 3 parts by mass, or in the range of from 0.01 to 3 parts by mass per 100 parts by mass of the present composition.

In addition, the present composition may also contain (F) an adhesion promoter in order to further improve adhesion to the substrate with which the composition makes contact during curing. Component (F) is preferably an organic silicon compound having one or more silicon-bonded alkoxy groups per molecule. Examples of the alkoxy groups include methoxy groups, ethoxy groups, propoxy groups, butoxy groups, and methoxyethoxy groups, and methoxy groups or ethoxy groups are particularly preferable. Examples of groups other than alkoxy groups bonding with the silicon atoms of this organic silicon compound include the same halogen-substituted or unsubstituted monovalent hydrocarbon groups as those described above such as alkyl groups, alkenyl groups, aryl groups, aralkyl groups, and halogenated alkyl groups; glycidoxyalkyl groups such as 3-glycidoxypropyl groups and 4-glycidoxybutyl groups; epoxycyclohexylalkyl groups such as 2-(3,4-epoxycyclohexyl)ethyl groups and 3-(3,4-epoxycyclohexyl)propyl groups; acrylic group-containing monovalent organic groups such as 3-methacryloxypropyl groups; isocyanate groups; isocyanurate groups; and hydrogen atoms. The organic silicon compound preferably has a group that can react with the alkenyl groups and/or silicon-bonded hydrogen atoms in the present composition. Specifically, the organic silicon compound preferably has silicon-bonded aliphatic unsaturated hydrocarbon groups or silicon-bonded hydrogen atoms.

Component (F) is preferably an organopolysiloxane represented by the average unit formula:

$(R^1R^2{}_2SiO_{1/2})_a(R^2R^3SiO_{2/2})_b(R^4SiO_{3/2})_c$,

In the formula, $R^1$ is an alkenyl group having from 2 to 12 carbons. Specific examples include a vinyl group, allyl group, butenyl group, pentenyl group, hexenyl group, heptenyl group, octenyl group, nonenyl group, decenyl group, undecenyl group, and dodecenyl group. Of these, a vinyl group is preferable.

In the formula, $R^2$ may be the same or different and are each an alkyl group having from 1 to 12 carbons, an aryl group having from 6 to 20 carbons, or an aralkyl group having from 7 to 20 carbons. Specific examples thereof include alkyl groups, such as a methyl group, ethyl group, propyl group, butyl group, pentyl group, hexyl group, heptyl group, octyl group, nonyl group, decyl group, undecyl group, and dodecyl group; alkenyl groups, such as a vinyl group, allyl group, butenyl group, pentenyl group, hexenyl group, heptenyl group, octenyl group, nonenyl group, decenyl group, undecenyl group, and dodecenyl group; aryl groups, such as a phenyl group, tolyl group, xylyl group, naphthyl group, anthracenyl group, phenanthryl group, and pyrenyl group; aralkyl groups, such as a naphthylethyl group, naphthylpropyl group, anthracenylethyl group, phenanthrylethyl group, and pyrenylethyl group; and groups in which some or all of the hydrogen atoms bonded in these aryl groups or aralkyl groups are substituted with an alkyl group such as a methyl group or an ethyl group, an alkoxy group such as a methoxy group or an ethoxy group, or halogen atoms such as a chlorine atom and bromine atom. A methyl group, vinyl group, or phenyl group is preferred.

In the formula, $R^3$ is an epoxy group-containing organic group. Specific examples include glycidoxyalkyl groups such as a 2-glycidoxyethyl group, 3-glycidoxypropyl group, or 4-glycidoxybutyl group; epoxycycloalkylalkyl groups such as a 2-(3,4-epoxycyclohexyl)-ethyl group or 3-(3,4-epoxycyclohexyl)-propyl group; and epoxyalkyl groups such as a 3,4-epoxybutyl group or 7,8-epoxyoctyl group. Glycidoxyalkyl groups are preferable, and a 3-glycidoxypropyl group is particularly preferable.

In the formula, $R^4$ is an aryl group having from 6 to 20 carbons or an aralkyl group having from 7 to 20 carbons, and examples thereof include the same groups described for the aforementioned $R^2$.

In the formula, a, b, and c are numbers satisfying: $0.1 \leq a \leq 0.6$, $0.1 \leq b \leq 0.5$, $0.3 \leq c < 0.8$, $0.15 \leq a/c \leq 1.5$, $0.15 \leq b/c \leq 1.8$, and $a+b+c=1$, and are preferably numbers satisfying: $0.1 \leq a \leq 0.5$, $0.1 \leq b \leq 0.45$, $0.3 \leq c < 0.7$, $0.15 \leq a/c \leq 1.5$, $0.15 \leq b/c \leq 1.8$, and $a+b+c=1$, and are more preferably numbers satisfying: $0.1 \leq a \leq 0.5$, $0.1 \leq b \leq 0.4$, $0.3 \leq c < 0.65$, $0.15 \leq a/c \leq 1.5$, $0.15 \leq b/c \leq 1.8$, and $a+b+c=1$. This is because, when the value of a is not less than the lower limit of the range described above, the obtained cured product is not likely to be sticky, while on the other hand, when it is not greater than the upper limit of the range described above, the obtained cured product has excellent adhesion. This is also because when the value of b is not less than the lower limit of the range described above, adhesion of the obtained cured product is good, while on the other hand, when it is not greater than the upper limit of the range described above, heat resistance of the obtained cured product is improved. This is also because when the value of c is not less than the lower limit of the range described above, the refractive index of the obtained cured product is good. This is also because when the value of a/c is not less than the lower limit of the range described above, adhesion of the obtained cured product is good, while on the other hand, when a/c is not greater than the upper limit of the range described above, curability of the obtained composition is good. This is also because when the value of b/c is not less than the lower limit of the range described above, adhesion of the obtained cured product is good, while on the other hand, when it is not greater than the upper limit of the range described above, heat resistance of the obtained cured product is good.

The content of component (F) is not limited, but is preferably in the range of from 0.0001 to 5 parts by mass, in the range of from 0.001 to 5 parts by mass, in the range of from 0.01 to 5 parts by mass, or in the range of from 0.01 to 3 parts by mass per 100 parts by mass of the present composition.

In addition, the present composition may also contain a diluent in order to reduce a viscosity of the present composition. The diluent preferably has a group that can react with the silicon-bonded hydrogen atoms in the present composition. Specifically, the diluent preferably has at least one aliphatic unsaturated hydrocarbon group per molecule. Examples of the diluent include 1,3,5,7-tetramethyl-1,3,5, 7-tetravinylcyclotetrasiloxane and 1,3,5,7-tetramethyl-1,3,5, 7-tetrahexenylcyclotetrasiloxane.

The content of the diluent is not limited, but it is preferably in an amount ranging from about 1 to 7 mass % of the composition.

Furthermore, the present composition may also contain a fluorescent substance that is used to obtain light of a desired wavelength by altering the wavelength of light emitted from a light emitting element that is encapsulated or covered with the cured product of the present composition. Examples of this type of fluorescent substance include yellow, red, green, and blue light emitting fluorescent substances consisting of oxide fluorescent substances, oxynitride fluorescent substances, nitride fluorescent substances, sulfide fluorescent substances, oxysulfide fluorescent substances, or the like, which are widely used in light emitting diodes (LEDs). Examples of oxide-based fluorescent substances include yttrium, aluminum, and garnet-type YAG green to yellow light-emitting fluorescent substances containing cerium ions; terbium, aluminum, and garnet-type TAG yellow light-emitting fluorescent substances containing cerium ions; and silicate green to yellow light-emitting fluorescent substances containing cerium or europium ions. Examples of oxynitride-based fluorescent substances include silicon, aluminum, oxygen, and nitrogen-type SiAlON red to green light-emitting fluorescent substances containing europium ions. Examples of nitride-based fluorescent substances include calcium, strontium, aluminum, silicon, and nitrogen-type CASN red light-emitting fluorescent substances containing europium ions. Examples of sulfide-based fluorescent substances include ZnS green light-emitting fluorescent substances containing copper ions or aluminum ions. Examples of oxysulfide-based fluorescent substances include $Y_2O_2S$ red light-emitting fluorescent substances containing europium ions. These fluorescent substances may be used as one type or as a mixture of two or more types. In the present composition, the content of the fluorescent substance is from 0.1 to 70 mass %, and preferably from 1 to 20 mass %, relative to the total amount of components (A) and (B).

Moreover, an inorganic filler such as silica, glass, alumina or zinc oxide; an organic resin fine powder of a polymethacrylate resin and the like; a heat-resistant agent, a dye, a pigment, a flame retardant, a solvent and the like may be incorporated as optional components in the present composition at levels that do not impair the object of the present invention.

Of the components added as optional components, in order to sufficiently suppress the discoloration of the silver electrodes or the silver plating of the substrate in the optical semiconductor device due to sulfur-containing gas in the air, it is possible to add at least one type of a fine powder having an average particle size from 0.1 nm to 5 µm selected from a group comprising zinc oxide fine powders surface-coated with at least one type of oxide of an element selected from a group comprising Al, Ag, Cu, Fe, Sb, Si, Sn, Ti, Zr, and rare earth elements, zinc oxide fine powders surface-treated with organosilicon compounds not having alkenyl groups, and hydrate fine powders of zinc carbonate.

In a zinc oxide fine powder surface-coated with an oxide, examples of rare earth elements include yttrium, cerium, and europium. Examples of the oxide on the surface of the zinc oxide fine powder include $Al_2O_3$, $AgO$, $Ag_2O$, $Ag_2O_3$, $CuO$, $Cu_2O$, $FeO$, $Fe_2O_3$, $Fe_3O_4$, $Sb_2O_3$, $SiO_2$, $SnO_2$, $Ti_2O_3$, $TiO_2$, $Ti_3O_5$, $ZrO_2$, $Y_2O_3$, $CeO_2$, $Eu_2O_3$, and mixtures of two or more of these oxides.

In a zinc oxide powder surface-treated with an organosilicon compound, the organosilicon compound does not have alkenyl groups, and examples include organosilanes, organosilazanes, polymethylsiloxanes, organohydrogenpolysiloxanes, and organosiloxane oligomers. Specific examples include organochlorosilanes such as trimethylchlorosilane, dimethylchlorosilane, and methyltrichlorosilane; organotrialkoxysilanes such as methyltrimethoxysilane, methyltriethoxysilane, phenyltrimethoxysilane, ethyltrimethoxysilane, n-propyltrimethoxysilane, and γ-methacryloxypropyltrimethoxysilane; diorganodialkoxysilanes such as dimethyldimethoxysilane, dimethyldiethoxysilane, and diphenyldimethoxysilane; triorganoalkoxysilanes such as trimethylmethoxysilane and trimethylethoxysilane; partial condensates of these organoalkoxysilanes; organosilazanes such as hexamethyldisilazane; and resin-like organopolysiloxanes containing a polymethylsiloxane, an organohydrogenpolysiloxane, an organosiloxane oligomer having a silanol group or an alkoxy group, an $R^6SiO_{3/2}$ unit (wherein $R^6$ is a monovalent hydrocarbon group excluding alkenyl groups, examples of which include alkyl groups such as a methyl group, ethyl group, or propyl group, and aryl groups such as a phenyl group), or an $SiO_{4/2}$ unit.

The present composition is such that curing proceeds either when left to stand at room temperature or when heated, but it is preferable to heat the composition in order to achieve rapid curing. The heating temperature is preferably in the range of from 50 to 200° C.

The present composition preferably forms a cured product with a type D durometer hardness of from 15 to 99 or from 30 to 95 as prescribed by JIS K 6253 when cured. This is because when the hardness of the cured product of the curable silicone composition is greater than or equal to the lower limit of the aforementioned range, it is strong and demonstrates sufficient protection, whereas when the hardness is less than or equal to the upper limit of the aforementioned range, the cured product becomes flexible and the durability is sufficient.

The present composition is preferably a curable silicone composition for sealing, coating, or adhering an optical semiconductor element.

Next, the optical semiconductor device of the present invention will be described in detail.

The optical semiconductor device of the present invention is characterized in that it has a silver electrode or a silver-plated substrate, and the electrode or substrate is sealed or covered with a cured product of the curable silicone composition described above. Examples of the optical semiconductor element in the optical semiconductor device include light-emitting diode (LED) elements, semiconductor laser elements, photodiode elements, phototransistor elements, solid-state image sensing devices, and light emitters and receivers for photocouplers; and the optical semiconductor element is particularly preferably a light-emitting diode (LED) element. The optical semiconductor device of the present invention will be explained in further detail by means of FIG. 1.

Figure 1:
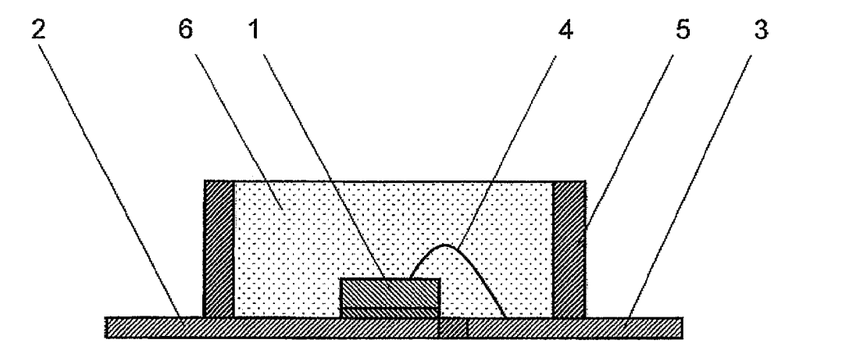
FIG. 1 is a cross-sectional view of an LED that is an example of an optical semiconductor device of the present invention.

FIG. 1 illustrates a cross-sectional view of a surface mounted type LED, which is one example of the optical semiconductor device of the present invention. In the LED illustrated in FIG. 1, the optical semiconductor element 1 is die-bonded to a lead frame 2, and this optical semiconductor element 1 is further wire-bonded to a lead frame 3 by a bonding wire 4. At the periphery of this optical semiconductor element 1, a light reflection material 5 is formed, and the optical semiconductor element 1 inside this light reflection material 5 is sealed by a cured product 6 of the curable silicone composition described above.

An example of a method of producing the surface mounted type LED illustrated in FIG. 1 is a method of die-bonding the optical semiconductor element 1 onto the lead frame 2 inside the light reflection material 5, wire-bonding the optical semiconductor element 1 and the lead frame 3 with a gold bonding wire 4, and then resin-sealing the optical semiconductor element 1 with the curable silicone composition described above.

EXAMPLES

The curable silicone composition and the optical semiconductor device of the present invention will be described in detail hereinafter using Practical Examples and Comparative Examples. In the chemical formulae, Me represents a methyl group, Vi represents a vinyl group, Ph represents a phenyl group, Ep represents 3-glycidoxypropyl group, and EO represents ethylene oxide group.

The following components were used as component (A).

Component (a-1): an organopolysiloxane represented by the average unit formula:

$(MePhViSiO_{1/2})_{0.23}(PhSiO_{3/2})_{0.77}$ (vinyl group content=4.6 mass %)

Component (a-2): an organopolysiloxane having a viscosity at 25° C. of 5 mPa·s and represented by the formula:

$(Me_2ViSiO)_3SiPh$ (vinyl group content=19.8 mass %)

Component (a-3): diphenylpolysiloxane having a viscosity at 25° C. of 3,000 mPa·s and represented by the average formula:

$Me_2ViSiO(MePhSiO)_{25}SiMe_2Vi$ (vinyl group content=1.4 mass %)

The following component was used as component (B).

Component (b-1): a diphenylpolysiloxane capped at both molecular terminals with dimethylhydrogensiloxy groups having a viscosity at 25° C. of 4 mPa·s and represented by the average formula:

$HMe_2SiO(Ph_2SiO)SiMe_2H$ (silicon-bonded hydrogen atom content=0.6 mass %)

The following components were used as component (C).

Component (c-1): 18-crown 6-ether (1,4,7,10,13,16-hexaoxacyclooctadecane)

Component (c-2): Phenol $(EO)_4$ acrylate (Miramer M144 produced by Miwon Specialty Chemical Co., Ltd.)

Component (c-3): Nonyl phenol $(EO)_8$ acrylate (Miramer M166 produced by Miwon Specialty Chemical Co., Ltd.)

The following component was used as component (D).

Component (d-1): 1,3-divinyltetramethyldisiloxane solution of a 1,3-divinyltetramethyl disiloxane platinum complex (platinum metal content in terms of mass units in this component=approximately 4,000 ppm).

The following component was used as component (E).

Component (e-1): 1-ethynylcyclohexan-1-ol

The following component was used as component (F).

Component (f-1): an organopolysiloxane having a viscosity at 25° C. of 20 Pa·s and represented by the average unit formula:

$(Me_2ViSiO_{1/2})_{0.18}(MeEpSiO_{1/2})_{0.29}(PhSiO_{3/2})_{0.53}$ (vinyl group content=3.6 mass %)

The following components were used as arbitrary components.

Component (g-1) as a diluent: a methylvinylcyclosiloxane having a viscosity at 25° C. of 3 mPa·s and represented by the average formula:

$(MeViSiO)$ (vinyl group content=31.4 mass %)

Component (g-2) as a filler to sufficiently suppress the discoloration: zinc oxide powder (Nanofine 50A produced by Sakai Chemical Industry Co., Ltd.)

[Viscosity of the Curable Silicone Compositions]

Viscosity at 25° C. of the curable silicone composition was measured by using a type B viscometer in accordance with JIS K 7117-1.

[Transmittance of Cured Product]

The curable silicone composition was press-molded under a pressure of 5 MPa for 1 hour at 150° C. to produce a sheet-like cured product having a thickness of 1 mm. The transparent of the sheet-like cured product was measured by a spectrophotometer (UV-1650PC manufactured by Shimadzu Corporation) at wavelength 450 nm.

[Hardness of Cured Product]

The curable silicone composition was press-molded under a pressure of 5 MPa for 1 hour at 150° C. to produce a sheet-like cured product. The hardness of the sheet-like cured product was measured by a type D durometer as specified in JIS K 6253.

[Production of Optical Semiconductor Device]

In addition, the optical semiconductor device illustrated in FIG. 1 was created by heating the curable silicone composition for 1 hour at 150° C. The sulfidation resistance and reliability were measured as follows by measuring the radiant flux of the optical semiconductor device.

[Sulfidation Resistance]

An initial radiant flux measurement was performed on the optical semiconductor device using a total radiant flux measurement apparatus utilizing integrating spheres. Next, this optical semiconductor device was placed in an autoclave with sodium sulfide hexahydrate, heated to 50° C. and was left to stand for 19 hours. A radiant flux measurement was then performed using a total radiant flux measurement apparatus utilizing integrating spheres.

[Reliability]

An initial radiant flux measurement was performed on the optical semiconductor device using a total radiant flux measurement apparatus utilizing integrating spheres. Next, this optical semiconductor device was placed under 85° C., 85% RH, and was left to stand for 1500 hours. A radiant flux measurement was then performed using a total radiant flux measurement apparatus utilizing integrating spheres.

Practical Examples 1 to 2 and Comparative Examples 1 to 4

The above components were uniformly mixed according to the compositions (parts by mass) shown in the following Table 1 to prepare the curable silicone compositions of Practical Examples 1 to 2 and Comparative Examples 1 to 4. Moreover, in Table 1, "SiH/Vi" represents the total moles of silicon-bonded hydrogen atoms in component (B) per 1 mole of total vinyl groups in component (A) in the curable silicone composition.

[Evaluation and Results]

The results of measurements of the curable silicone composition and the cured products, and measurements of sulfidation resistance of the optical semiconductor device are shown in Table 1 for the curable silicone compositions obtained in Practical Examples 1 to 2 and Comparative Examples 1 to 4.

TABLE 1

| | | | Category | | | | | |
|---|---|---|---|---|---|---|---|---|
| Item | | | Prac. Example 1 | Prac. Example 2 | Comp. Example 1 | Comp. Example 2 | Comp. Example 3 | Comp. Example 4 |
| Composition of curable silicone composition (parts by mass) | (A) | (a-1) | 65.10 | 65.08 | 65.38 | 65.36 | 65.10 | 65.10 |
| | | (a-2) | 4.13 | 4.13 | 4.13 | 4.13 | 4.13 | 4.13 |
| | | (a-3) | 1.00 | 1.00 | 1.00 | 1.00 | 1.00 | 1.00 |
| | (B) | (b-1) | 26.34 | 26.33 | 26.45 | 26.44 | 26.34 | 26.34 |
| | (C) | (c-1) | 0.40 | 0.40 | — | — | — | — |
| | | (c-2) | — | — | — | — | 0.40 | — |
| | | (c-3) | — | — | — | — | — | 0.40 |
| | (D) | (d-1) | 0.008 | 0.008 | 0.008 | 0.008 | 0.008 | 0.008 |
| | (E) | (e-1) | 0.03 | 0.03 | 0.03 | 0.03 | 0.03 | 0.03 |
| | (F) | (f-1) | 1.00 | 1.00 | 1.00 | 1.00 | 1.00 | 1.00 |
| | (G) | (g-1) | 2.00 | 2.00 | 2.00 | 2.00 | 2.00 | 2.00 |
| | | (g-2) | — | 0.03 | — | 0.03 | — | — |
| SiH/Vi | | | 1.1 | 1.1 | 1.1 | 1.1 | 1.1 | 1.1 |
| Viscosity (mPa·s) | | | 840 | 840 | 840 | 840 | 840 | 840 |
| Cured Product | Hardness | | 73 | 73 | 73 | 73 | 73 | 73 |
| | Transmittance (%) | | 100 | 88 | 100 | 88 | 99 | 100 |
| Sulfidation Resistance | Initial light extraction efficiency (%) | | 100 | 100 | 100 | 100 | 100 | 100 |
| | Light extraction efficiency after 19 hours (%) | | 71 | 79 | 60 | 68 | 63 | 65 |

Practical Examples 3 to 5 and Comparative Example 5

The above components were uniformly mixed according to the compositions (parts by mass) shown in the following Table 2 to prepare the curable silicone compositions of Practical Examples 3 to 5 and Comparative Example 5. Moreover, in Table 2, "SiH/Vi" represents the total moles of silicon-bonded hydrogen atoms in component (B) per 1 mole of total vinyl groups in component (A) in the curable silicone composition.

Evaluation and Results

The results of measurements of the curable silicone composition and the cured products, and measurements of sulfidation resistance of the optical semiconductor device are shown in Table 2 for the curable silicone compositions obtained in Practical Examples 3 to 5 and Comparative Example 5.

TABLE 2

| | | | Category | | | |
|---|---|---|---|---|---|---|
| Item | | | Prac. Example 3 | Prac. Example 4 | Prac. Example 5 | Comp. Example 5 |
| Composition of curable silicone composition (parts by mass) | (A) | (a-1) | 65.31 | 65.24 | 65.10 | 65.38 |
| | | (a-2) | 4.13 | 4.13 | 4.13 | 4.13 |
| | | (a-3) | 1.00 | 1.00 | 1.00 | 1.00 |
| | (B) | (b-1) | 26.42 | 26.39 | 26.34 | 26.45 |
| | (C) | (c-1) | 0.10 | 0.20 | 0.40 | — |
| | (D) | (d-1) | 0.008 | 0.008 | 0.008 | 0.008 |
| | (E) | (e-1) | 0.03 | 0.03 | 0.03 | 0.03 |
| | (F) | (f-1) | 1.00 | 1.00 | 1.00 | 1.00 |
| | (G) | (g-1) | 2.00 | 2.00 | 2.00 | 2.00 |
| SiH/Vi | | | 1.1 | 1.1 | 1.1 | 1.1 |
| Viscosity (mPa·s) | | | 840 | 840 | 840 | 840 |
| Cured Product | Hardness | | 73 | 73 | 73 | 73 |
| | Transmittance (%) | | 100 | 88 | 100 | 88 |
| Sulfidation Resistance | Initial light extraction efficiency (%) | | 100 | 100 | 100 | 100 |
| | Light extraction efficiency after 19 hours (%) | | 83 | 83 | 86 | 78 |

It was confirmed from the results shown in Tables 1 to 2 that the optical semiconductor devices produced using the curable silicone compositions of Practical Examples 1 to 5 have sulfidation resistance.

Practical Example 6 and Comparative Example 6

The above components were uniformly mixed according to the compositions (parts by mass) shown in the following Table 3 to prepare the curable silicone compositions of Practical Example 6 and Comparative Example 6. Moreover, in Table 3, "SiH/Vi" represents the total moles of silicon-bonded hydrogen atoms in component (B) per 1 mole of total vinyl groups in component (A) in the curable silicone composition.

Evaluation and Results

The results of measurements of the curable silicone composition and the cured products, and measurements of sulfidation resistance of the optical semiconductor device are shown in Table 3 for the curable silicone compositions obtained in Practical Example 6 and Comparative Example 6.

TABLE 3

| | | | Category | |
|---|---|---|---|---|
| Item | | | Prac. Example 6 | Comp. Example 6 |
| Composition of curable silicone composition (parts by mass) | (A) | (a-1) | 65.10 | 65.40 |
| | | (a-2) | 4.13 | 4.13 |
| | | (a-3) | 1.00 | 1.00 |
| | (B) | (b-1) | 26.34 | 26.50 |
| | (C) | (c-1) | 0.40 | — |
| | (D) | (d-1) | 0.008 | 0.008 |
| | (E) | (e-1) | 0.03 | 0.03 |
| | (F) | (f-1) | 1.00 | 1.00 |
| | (G) | (g-1) | 2.00 | 2.00 |
| SiH/Vi | | | 1.1 | 1.1 |
| Viscosity (mPa · s) | | | 840 | 840 |
| Cured Product | Hardness | | 73 | 73 |
| | Transmittance (%) | | 100 | 88 |
| Reliability test | Initial light extraction efficiency (%) | | 100 | 100 |
| | Light extraction efficiency after 1500 hours (%) | | 96 | 93 |

It was confirmed from the results shown in Table 3 that the optical semiconductor device produced using the curable silicone composition of Practical Example 6 has good reliability.

INDUSTRIAL APPLICABILITY

The curable silicone composition of the present invention can form a cured product which inhibits the discoloration of silver electrodes or a silver-plated substrate due to a sulfur-containing gas in the air, and it is therefore suitable as a sealing agent, a coating agent, or an adhesive for an optical semiconductor element in an optical semiconductor device or as a protective agent of a silver electrode or a silver-plated substrate of a liquid crystal terminal.

REFERENCE NUMBERS

1 Light emitting element
2 Lead frame
3 Lead frame
4 Bonding wire
5 Frame material
6 Cured product of curable silicone composition

The invention claimed is:

1. A hydrosilylation-curable silicone composition, said composition comprising:
   (A) an organopolysiloxane having at least two aliphatic unsaturated hydrocarbon groups per molecule;
   (B) an organohydrogenpolysiloxane having at least two silicon-bonded hydrogen atoms per molecule;
   (C) at least one type of a crown compound in an amount of 0.05 to 2% by mass of the composition; and
   (D) a hydrosilylation reaction catalyst.

2. The hydro silylation-curable silicone composition according to claim 1, wherein the crown compound is selected from the group of a crown ether compound, a cyclic polyamine compound, a cyclic polythioether compound, or combinations thereof.

3. The hydro silylation-curable silicone composition according to claim 2, wherein the crown compound is a crown ether compound, and wherein the crown ether compound is selected from the group of a benzo crown ether compound, a dibenzo crown ether compound, an aminobenzo crown ether compound, an acetylbenzo crown ether compound, a carboxybenzo crown ether compound, a bromobenzo crown ether compound, an aza crown ether compound, a diaza crown ether compound, or combinations thereof.

4. The hydro silylation-curable silicone composition according to claim 1, further comprising:
   (E) a hydrosilylation reaction inhibitor, in an amount from 0.01 to 3 parts by mass per total 100 parts by mass of components (A) to (D).

5. The hydro silylation-curable silicone composition according to claim 1, further comprising:
   (F) an adhesion promotor, in an amount from 0.01 to 3 parts by mass per total 100 parts by mass of components (A) to (D).

6. The hydro silylation-curable silicone composition according to claim 1, which is a composition for sealing, coating, or adhering an optical semiconductor element.

7. The hydrosilylation-curable silicone composition according to claim 1, wherein the hydrosilylation-curable silicone composition comprises a diluent (G) that can react with the silicon-bonded hydrogen atoms in the hydrosilylation-curable silicone composition.

8. The hydrosilylation-curable silicone composition according to claim 7, wherein the diluent (G) has at least one aliphatic unsaturated hydrocarbon group per molecule.

9. The curable silicone composition according to claim 7, wherein the diluent (G) is selected from the group of 1,3,5,7-tetramethyl-1,3,5,7-tetravinylcyclotetrasiloxane and 1,3,5,7-tetramethyl-1,3,5,7-tetrahexenylcyclotetrasiloxane, and combinations thereof.

10. The hydrosilylation-curable silicone composition according to claim 7, wherein the diluent (G) present in an amount ranging from about 1 to 7 mass % of the hydrosilylation-curable silicone composition.

11. The hydrosilylation-curable silicone composition according to claim 1, further comprising zinc oxide surface-coated with at least one type of oxide of an element selected from the group of Al, Ag, Cu, Fe, Sb, Si, Sn, Ti, Zr, and rare earth elements, zinc oxide fine powders surface-treated with organosilicon compounds not having alkenyl groups, and hydrate fine powders of zinc carbonate.

12. The hydrosilylation-curable silicone composition according to claim 11, wherein the zinc oxide has an average particle size from 0.1 nm to 5 μm.

13. The hydrosilylation-curable silicone composition according to claim 12, wherein the zinc oxide is surface-coated silica and/or alumina.

14. The hydrosilylation-curable silicone composition according to claim 12, wherein the zinc oxide is surface-coated with an organosilicon compound.

15. An optical semiconductor device comprising:
an optical semiconductor element on silver electrodes or a silver-plated substrate;
wherein the optical semiconductor element is sealed, coated, or adhered with a cured product of the hydrosilylation-curable silicone composition according to claim 1.

16. The optical semiconductor device according to claim 15, wherein the optical semiconductor element is a light emitting diode.

\* \* \* \* \*